(12) United States Patent
Salcedo et al.

(10) Patent No.: US 11,362,203 B2
(45) Date of Patent: Jun. 14, 2022

(54) ELECTRICAL OVERSTRESS PROTECTION FOR ELECTRONIC SYSTEMS SUBJECT TO ELECTROMAGNETIC COMPATIBILITY FAULT CONDITIONS

(71) Applicant: Analog Devices, Inc., Norwood, MA (US)

(72) Inventors: Javier A. Salcedo, North Billerica, MA (US); Linfeng He, Shenzhen (CN)

(73) Assignee: Analog Devices, Inc., Norwood, MA (US)

( * ) Notice: Subject to any disclaimer, the term of this patent is extended or adjusted under 35 U.S.C. 154(b) by 66 days.

(21) Appl. No.: 16/719,490

(22) Filed: Dec. 18, 2019

(65) Prior Publication Data

US 2021/0098614 A1 Apr. 1, 2021

Related U.S. Application Data

(60) Provisional application No. 62/906,307, filed on Sep. 26, 2019.

(51) Int. Cl.
*H01L 27/02* (2006.01)
*H01L 29/74* (2006.01)
(Continued)

(52) U.S. Cl.
CPC ...... *H01L 29/7436* (2013.01); *H01L 27/0248* (2013.01); *H01L 27/0817* (2013.01);
(Continued)

(58) Field of Classification Search
CPC ............. H01L 29/7408; H01L 29/7436; H01L 27/0248; H01L 27/0262; H01L 29/0649;
(Continued)

(56) References Cited

U.S. PATENT DOCUMENTS 5,786,617 A 7/1998 Merrill et al.
5,895,940 A 4/1999 Kim
(Continued)

FOREIGN PATENT DOCUMENTS

CN 104269402 B 5/2017
CN 109713916 A 5/2019
(Continued)

OTHER PUBLICATIONS

C. Dai and M. Ker, "ESD Protection Design with Stacked High-Holding-Voltage SCR for High-Voltage Pins in a Battery-Monitoring IC," in IEEE Transactions on Electron Devices, vol. 63, No. 5, pp. 1996-2002, May 2016.
(Continued)

*Primary Examiner* — Shouxiang Hu
(74) *Attorney, Agent, or Firm* — Knobbe, Martens, Olson & Bear, LLP

(57) ABSTRACT

Electrical overstress protection for electronic systems subject to electromagnetic compatibility fault conditions are provided herein. In certain implementations, a stacked thyristor protection structure with a high holding voltage includes a protection device having a trigger voltage and a holding voltage. A trigger voltage of the stacked thyristor protection structure is substantially equal to the trigger voltage of the protection device. The stacked thyristor protection structure further includes at least one resistive thyristor electrically connected to the protection device and operable to increase a holding voltage of the stacked thyristor protection structure relative to the holding voltage of the protection device. The at least one resistive thyristor comprising a PNP bipolar transistor and a NPN bipolar transistor that are cross-coupled, and a conductor connecting a collector of the PNP bipolar transistor to a collector of the NPN bipolar transistor.

20 Claims, 12 Drawing Sheets

(51) Int. Cl.
  *H01L 27/08* (2006.01)
  *H01L 27/12* (2006.01)
  *H01L 29/08* (2006.01)

(52) U.S. Cl.
  CPC ...... *H01L 27/1207* (2013.01); *H01L 29/0839* (2013.01); *H01L 29/7408* (2013.01)

(58) Field of Classification Search
  CPC .......... H01L 29/87; H01L 27/0207; H01L 27/0921; H01L 27/0928; H01L 29/0834; H01L 29/41716; H01L 29/74; H01L 27/1027; H01L 29/0839; H01L 29/747; H01L 27/0817
  See application file for complete search history.

(56) References Cited

U.S. PATENT DOCUMENTS

| | | | |
|---|---|---|---|
| 6,016,002 | A | 1/2000 | Chen et al. |
| 6,594,132 | B1 | 7/2003 | Avery |
| 6,713,818 | B2 | 3/2004 | Kodama |
| 6,768,616 | B2 | 7/2004 | Mergens et al. |
| 6,894,321 | B2 | 5/2005 | Morishita |
| 7,064,393 | B2 | 6/2006 | Mergens et al. |
| 7,274,047 | B2 | 9/2007 | Russ et al. |
| 7,773,356 | B2 | 8/2010 | Ryu et al. |
| 8,120,887 | B2 | 2/2012 | Mallikararjunaswamy et al. |
| 8,405,943 | B2 | 3/2013 | Song et al. |
| 8,503,140 | B2 | 8/2013 | Abou-khalil et al. |
| 8,665,571 | B2 | 3/2014 | Salcedo et al. |
| 8,755,156 | B2 | 6/2014 | Tailliet |
| 8,772,091 | B2 | 7/2014 | Salcedo et al. |
| 8,860,080 | B2 | 10/2014 | Salcedo |
| 9,576,945 | B2 | 2/2017 | Lee et al. |
| 9,741,704 | B2 | 8/2017 | Chang et al. |
| 9,871,373 | B2 | 1/2018 | O'Donnell et al. |
| 9,929,142 | B2 | 3/2018 | Ivanov et al. |
| 9,954,356 | B2 | 4/2018 | Parthasarathy et al. |
| 10,008,490 | B2* | 6/2018 | Salcedo ............ H01L 27/0259 |
| 10,020,299 | B2 | 7/2018 | Lai |
| 10,079,227 | B2 | 9/2018 | Xiu et al. |
| 10,134,724 | B2* | 11/2018 | Lee .................... H01L 29/7408 |
| 10,177,566 | B2 | 1/2019 | Zhao et al. |
| 10,249,609 | B2 | 4/2019 | Salcedo et al. |
| 10,700,056 | B2 | 6/2020 | Zhao et al. |
| 2009/0244797 | A1 | 10/2009 | Sawahata |
| 2010/0090283 | A1 | 4/2010 | Langguth et al. |
| 2012/0293904 | A1 | 11/2012 | Salcedo et al. |
| 2014/0138740 | A1* | 5/2014 | Hu .................... H01L 21/32055 257/173 |
| 2014/0167106 | A1 | 6/2014 | Salcedo |
| 2014/0339601 | A1 | 11/2014 | Salcedo et al. |
| 2015/0236011 | A1* | 8/2015 | Wang ..................... H01L 29/87 257/173 |
| 2016/0300830 | A1 | 10/2016 | Salcedo et al. |
| 2016/0329094 | A1 | 11/2016 | Luan et al. |
| 2017/0194315 | A1 | 7/2017 | Huang et al. |
| 2017/0221876 | A1 | 8/2017 | Huang et al. |
| 2017/0317070 | A1 | 11/2017 | Salcedo et al. |
| 2018/0088155 | A1 | 3/2018 | Clarke et al. |
| 2018/0226788 | A1 | 8/2018 | Salcedo et al. |
| 2018/0308846 | A1 | 10/2018 | Huang et al. |
| 2019/0051646 | A1 | 2/2019 | Salcedo et al. |
| 2019/0128939 | A1 | 5/2019 | O'Donnell et al. |
| 2019/0131787 | A1 | 5/2019 | He et al. |
| 2020/0066709 | A1 | 2/2020 | Chen et al. |
| 2020/0152578 | A1 | 5/2020 | Gifford et al. |
| 2020/0342070 | A1 | 10/2020 | Parris et al. |
| 2020/0381417 | A1* | 12/2020 | Salcedo ................ H02H 9/046 |

FOREIGN PATENT DOCUMENTS

| | | |
|---|---|---|
| EP | 2806462 A1 | 11/2014 |
| KR | 101489328 B1 | 2/2015 |
| WO | WO 2010/029672 A1 | 3/2010 |

OTHER PUBLICATIONS

J. A. Salcedo, J. Hajjar, S. Malobabic and J. J. Liou, "Bidirectional Devices for Automotive-Grade Electrostatic Discharge Applications," in IEEE Electron Device Letters, vol. 33, No. 6, pp. 860-862, Jun. 2012.

Z. Liu, J. J. Liou, S. Dong and Y. Han, "Silicon-Controlled Rectifier Stacking Structure for High-Voltage ESD Protection Applications," in IEEE Electron Device Letters, vol. 31, No. 8, pp. 845-847, Aug. 2010.

Do et al. "A Silicon Controlled Rectifier-Based ESD Protection Circuit with High Holding Voltage and High Robustness Characteristics" International Journal of Electrical, Computer, Energetic, Electronic and Communication Engineering vol. 12, No. 3 dated 2018, in 4 pages. dated 2018.

Kim et al. "SCR-Stacking Structure with High Holding Voltage for I/O and Power Clamp" International Journal of Electrical, Computer, Energetic, Electronic and Communication Engineering vol. 9, No. 6 dated 2015, in 4 pages.

* cited by examiner

ELECTRICAL OVERSTRESS PROTECTION FOR ELECTRONIC SYSTEMS SUBJECT TO ELECTROMAGNETIC COMPATIBILITY FAULT CONDITIONS

CROSS-REFERENCE TO RELATED APPLICATIONS

The present application claims priority to U.S. Provisional Patent Application No. 62/906,307, filed Sep. 26, 2019, and titled "ELECTRICAL OVERSTRESS PROTECTION FOR ELECTRONIC SYSTEMS SUBJECT TO ELECTROMAGNETIC COMPATIBILITY FAULT CONDITIONS," the entirety of which is hereby incorporated herein by reference.

FIELD OF THE DISCLOSURE

Embodiments of the invention relate to electronic systems, and more particularly to, electrical overstress protection of electronic systems such as mission-critical circuit applications subject to electromagnetic compatibility (EMC) fault conditions.

BACKGROUND

Electronic systems can be exposed to environment-induced electrical random overstress events, or electrical signals of short duration having rapidly changing voltage and high power. Electrical overstress events include, for example, electrical overstress (EOS) and electrostatic discharge (ESD) arising from the abrupt release of charge from an object or person to an electronic system and can happen at any time during the handling and use of integrated circuits.

Electrical overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

Electrical overstress protection for electronic systems subject to electromagnetic compatibility fault conditions are provided herein. In certain configurations herein, a stacked thyristor protection structure includes a protection device having a trigger voltage and a holding voltage. A trigger voltage of the stacked thyristor protection structure is substantially equal to the trigger voltage of the protection device. The stacked thyristor protection structure further includes at least one resistive thyristor electrically connected to the protection device and operable to increase a holding voltage of the stacked thyristor protection structure relative to the holding voltage of the protection device. Thus, by including the resistive thyristor in the stacked thyristor protection structure, the holding voltage of the stacked thyristor protection structure is enhanced relative to an implementation in which only the protection device is included. Furthermore, the enhancement in holding voltage can be realized with little to no impact on trigger voltage. To achieve such an enhancement, the resistive thyristor includes a PNP bipolar transistor and a NPN bipolar transistor that are cross-coupled, and a conductor connecting a collector of the PNP bipolar transistor to a collector of the NPN bipolar transistor. By including the conductor between the collectors of the transistors, the resistive thyristor behaves as a resistor at low current levels while still behaving as a thyristor at high current levels. Thus, the resistive thyristor exhibits both resistor characteristics and thyristor characteristics based on a level of current flow though the resistive thyristor.

In one aspect, a stacked thyristor protection structure with high holding voltage is provided. The stacked thyristor protection structure includes a protection device having a trigger voltage and a holding voltage, wherein a trigger voltage of the stacked thyristor protection structure is substantially equal to the trigger voltage of the protection device, and at least one resistive thyristor electrically connected to the protection device and operable to increase a holding voltage of the stacked thyristor protection structure relative to the holding voltage of the protection device. The at least one resistive thyristor includes a PNP bipolar transistor and a NPN bipolar transistor that are cross-coupled, and a conductor connecting a collector of the PNP bipolar transistor to a collector of the NPN bipolar transistor.

In another aspect, a resistive thyristor with a high holding voltage is provided. The resistive thyristor includes a PNP bipolar transistor, a NPN bipolar transistor cross-coupled with the PNP bipolar transistor, a conductor connecting a collector of the PNP bipolar transistor to a collector of the NPN bipolar transistor, the conductor configured to serve as a bypass terminal, a first anode terminal connected to an emitter of the PNP bipolar transistor, and a first cathode terminal connected to an emitter of the NPN bipolar transistor.

In yet another aspect, a semiconductor die is provided. The semiconductor die includes a first pad and a second pad, and a stacked thyristor protection structure electrically connected between the first pad and the second pad, the stacked thyristor protection structure including a protection device having a holding voltage, and at least one resistive thyristor electrically connected to the protection device and operable to increase a holding voltage of the stacked thyristor protection structure relative to the holding voltage of the protection device. The at least one resistive thyristor includes a PNP bipolar transistor and a NPN bipolar transistor that are cross-coupled, and a conductor connecting a collector of the PNP bipolar transistor to a collector of the NPN bipolar transistor.

DETAILED DESCRIPTION

Figure 1A:
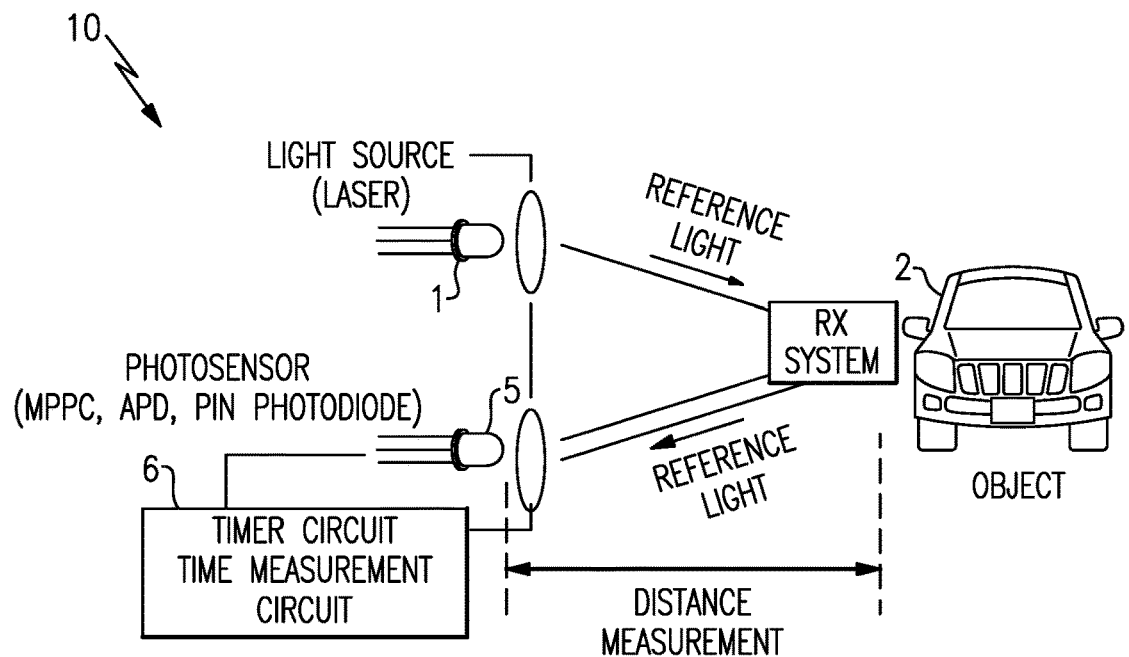
FIG. 1A is a schematic diagram of an automotive lidar receiver system for safety and autonomous driving applications.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include overstress protection circuits to protect circuits or components from electrical overstress events. To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of electrical overstress events, including electrical overstress (EOS) and/or electrostatic discharge (ESD).

Optimized silicon-controlled-rectifier (SCR) device topologies are often considered for ESD protection applications to achieve a higher level of robustness. However, the relatively low holding voltage of an SCR limits its usage, particularly in higher voltage tolerant operating conditions in which the risk of a transient electrical overstress-induced latch-up during normal operations is present.

To avoid the potential risks of latch-up, an alternative is to raise the holding voltage of the SCR close to or higher than the interface circuit operation voltage. In one example, the holding voltage of the SCR is raised using complex processing technologies. In another example, connecting SCR structures in series achieves a high holding voltage condition.

By arranging multiple clamps in series, within the constraints of the isolation breakdown the holding voltage can be increased proportionally with the number of devices connected in series, but also the trigger voltage will increase in the same proportion. The increase of the trigger voltage introduces a limitation of this design option. For example, increasing the trigger voltage is unacceptable in cases where the narrow breakdown voltage of the technology requires interface protection clamps with relatively low trigger voltage to prevent electrical overstress damage in the integrated circuit (IC) subsystems, a common condition in emerging precision applications.

FIG. 1A is a schematic diagram of an automotive lidar receiver system 10 for safety and autonomous driving applications. The automotive lidar receiver system 10 includes a light source (for instance, a laser) 1 for outputting reference light, and a photosensor (for instance, a multi-pixel photon counter (MPPC), an avalanche photodiode (APD), and/or a PIN photodiode) for receiving a portion of the reference light that is reflected from an object 2. The automotive lidar receiver system 10 further includes a timer circuit 6 for estimating a distance to the object 2 based on an observed time difference between outputting the reference light and receiving the reflected light.

Figure 1B:
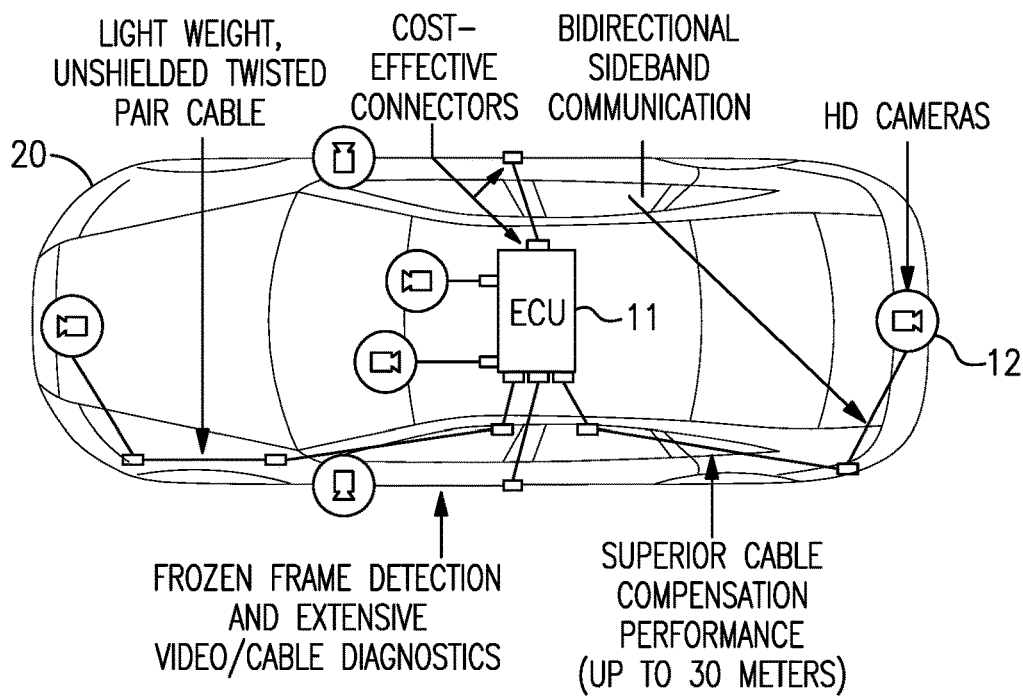
FIG. 1B is a schematic diagram of an automobile including high definition cameras for safety and autonomous driving applications.

FIG. 1B is a schematic diagram of an automobile 20 including high definition cameras 12 for safety and autonomous driving applications. The automobile 20 includes an engine control unit (ECU) 11 that is connected to high definition (HD) cameras 12 by way of cost-effective connections.

Figure 1C:
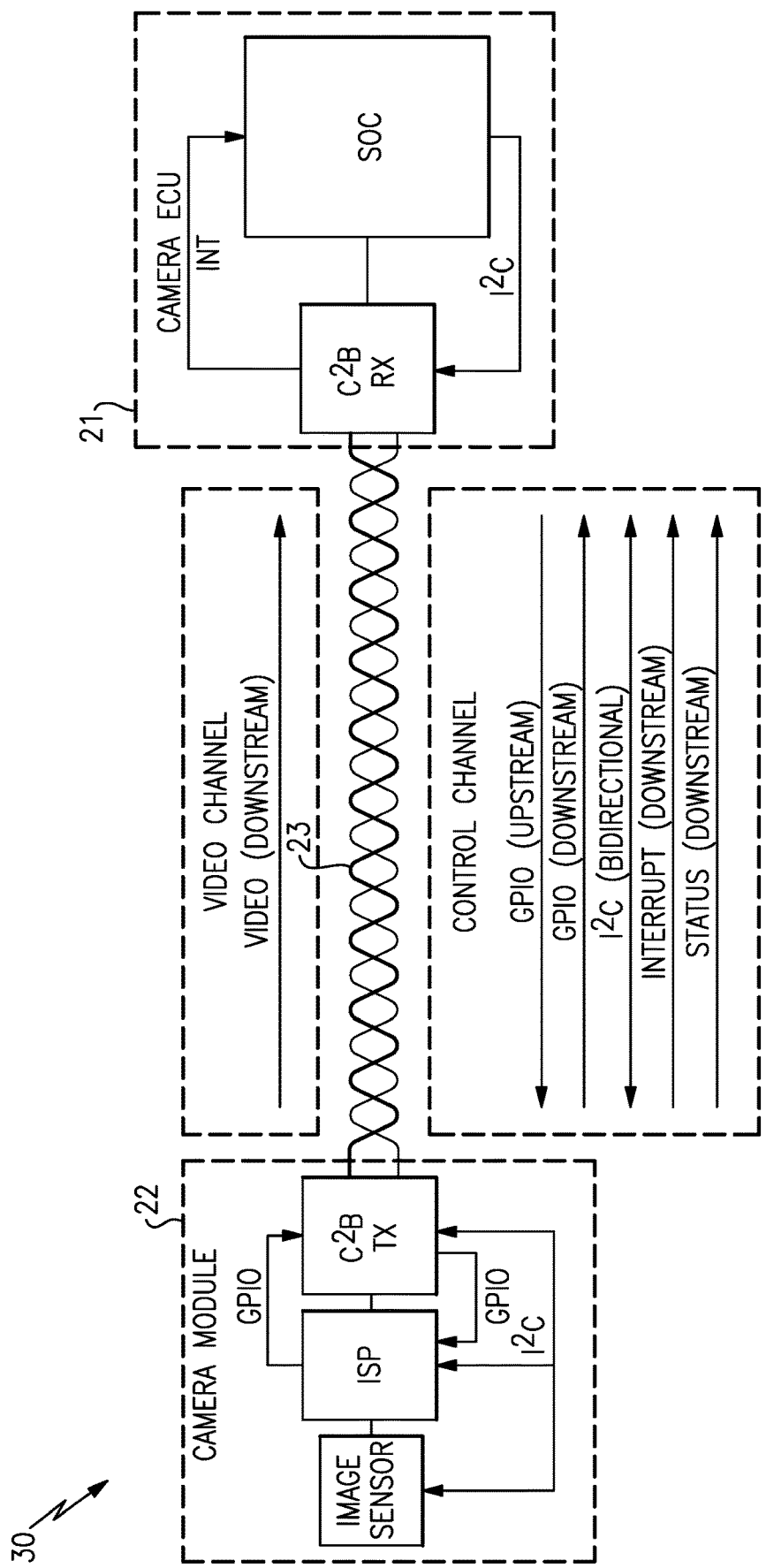
FIG. 1C is a car camera link interface for the automobile internal video communication in connection with FIG. 1B.

FIG. 1C is a car camera link interface 30 for the automotive safety 20 of FIG. 1B. The camera link interface 30 includes a camera ECU 21 connected to a camera module 22 over a communication channel 23. The communications between the camera ECU 21 and the camera module 22 include a video channel for providing video data captured from the camera module 22 to the camera ECU 21 and a control channel for handling unidirectional and bidirectional control communications between the camera ECU 21 and the camera module 22.

Figure 1D:
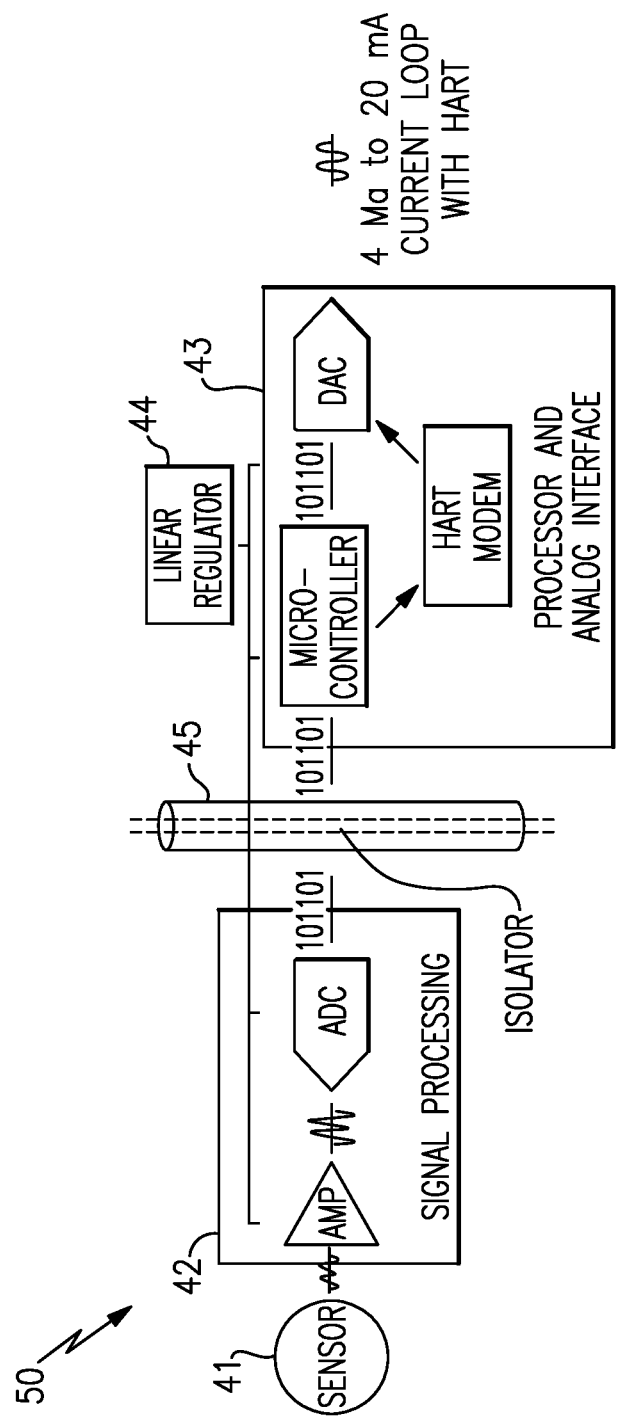
FIG. 1D is a schematic diagram of an Industry 4.0 instrumentation interface application embodiment.

FIG. 1D is a schematic diagram of an Industry 4.0 instrumentation interface 50 often subject to electrical overstress in the harsh industrial environment. The Industry 4.0 instrumentation interface 50 includes a sensor 41, a signal processing circuit 42, a processor and analog interface 43, a linear regulator 44, and an isolator 45.

FIGS. 1A-1D represent reference applications in which the present disclosure serves to provide a flexible high holding voltage design while preventing an increase in the trigger voltage and/or degradation in the current handling capability. Such applications can be exposed to a wide variety of overstress conditions, including EMC fault conditions in the electronic system normal operation.

Overview of Stacked Thyristor Protection Structures

In certain embodiments herein, a stacked thyristor protection structure is connected between a first pad and a second pad of a semiconductor die (for instance, between a signal pad and a ground pad) to protect circuitry of the die from electrical overstress, such as electromagnetic compatibility (EMC) fault conditions. The stacked thyristor protection structure includes at least one resistive thyristor electrically connected in a stack with one or more other protection devices, such as conventional thyristors, bipolar transistors, diodes, and/or field-effect transistors (FETs). A thyristor is also referred to herein as a silicon-controlled rectifier (SCR), and a resistive thyristor is also referred to herein as a resistive silicon-controlled rectifier (RSCR).

By including the resistive thyristor in the stacked thyristor protection structure, the holding voltage of the stacked thyristor protection structure is enhanced relative to an implementation in which only the thyristor is connected between the pads. Furthermore, the enhancement in holding voltage can be realized with little to no impact on trigger voltage, an important consideration in highly integrated circuit applications implemented in advanced and lower breakdown voltage semiconductor fabrication technologies. For example, in certain implementations when the stacked thyristor structure includes a stack of a base thyristor and a resistive thyristor, the stacked thyristor protection structure operates with a trigger voltage about equal to a trigger voltage of the base thyristor, while having a holding voltage about equal to a sum of a holding voltage of the base thyristor and a holding voltage of the resistive thyristor.

The resistive thyristor includes a PNP bipolar transistor and an NPN bipolar transistor that are cross-coupled, with a base of the PNP bipolar transistor electrically connected to a collector of the NPN bipolar transistor and with a base of the NPN bipolar transistor electrically connected to a collector of the PNP bipolar transistor. However, the resistive thyristor further includes a conductor (for instance, a connection in metallization) connected between the collector of the PNP bipolar transistor and the collector of the NPN bipolar transistor.

In certain implementations, terminals are provided in metallization for the emitter of the PNP bipolar transistor, the base of the PNP bipolar transistor, the conductor, the base of the NPN bipolar transistor, and the emitter of the NPN bipolar transistor. In such implementations, a five terminal resistive thyristor is provided for padding the holding voltage of the protection structure in which the resistive thyristor is incorporated.

By including the conductor between the collectors of the transistors, the resistive thyristor behaves as a resistor at low current levels while still behaving as a thyristor at high current levels. Thus, the resistive thyristor exhibits both resistor characteristics and thyristor characteristics based on a level of current flow though the resistive thyristor. A resistive path is intentionally embedded in the structure to preserve the trigger voltage characteristics when this device is introduced as a holding voltage padding structure. Since the resistive path can be connected independently from the SCR path, the negative impact of stacking on the trigger voltage can be prevented by introducing this device topology into a stack.

For example, in certain implementations, a base of the PNP bipolar transistor is formed by an n-type semiconductor well (NW or n-well) and a base of the NPN bipolar transistor is formed by a p-type semiconductor well (PW or p-well). Additionally, at low current levels, a metal connection serves to bypass the semiconductor interface or p-n junction between the PW and the NW, and thus the resistive thyristor behaves as a resistor having a resistance based on a sum of a resistance of the NW and a resistance of the PW. However, at high current levels, the resistive thyristor operates with regenerative feedback and behaves as a thyristor.

Accordingly, including one or more resistive thyristors in a stack provides the benefit of high holding voltage. Furthermore, the stacked arrangement results in certain junction capacitances being in series between the pads, which leads to a reduction in capacitive loading. Thus, the stacked thyristor protection structures provide fast-transient current handling capability per unit area while exhibiting reduced parasitic capacitance.

Such stacked thyristor protection structures are suitable for on-chip electrical overstress damage prevention during fault operating conditions. The mixed resistive and SCR characteristics of the resistive thyristor enable a flexible high holding voltage design, by embedding the padding topology along with existing optimized low holding voltage baseline devices for high current handling capability.

Moreover, folded and modified folded improved stacking topologies are provided to meet different design conditions in precision mixed-signal mission critical interface applications.

Simulation results demonstrate achievement of a much higher holding voltage and address limitations in conventional low holding voltage clamps, while reducing or eliminating an increase in the trigger voltage and/or degradation in current handling capability. In one example, the failure current of the stacked thyristor protection structure is also improved by 50% by enhancing the device's conduction path.

The stacked thyristor protection structures herein can be fabricated using a range of process technologies, including, but not limited to, sub-28 nm CMOS, SiGe BiCMOS, CMOS SOI, FinFET, and/or high voltage BCDMOS.

Figure 2A:
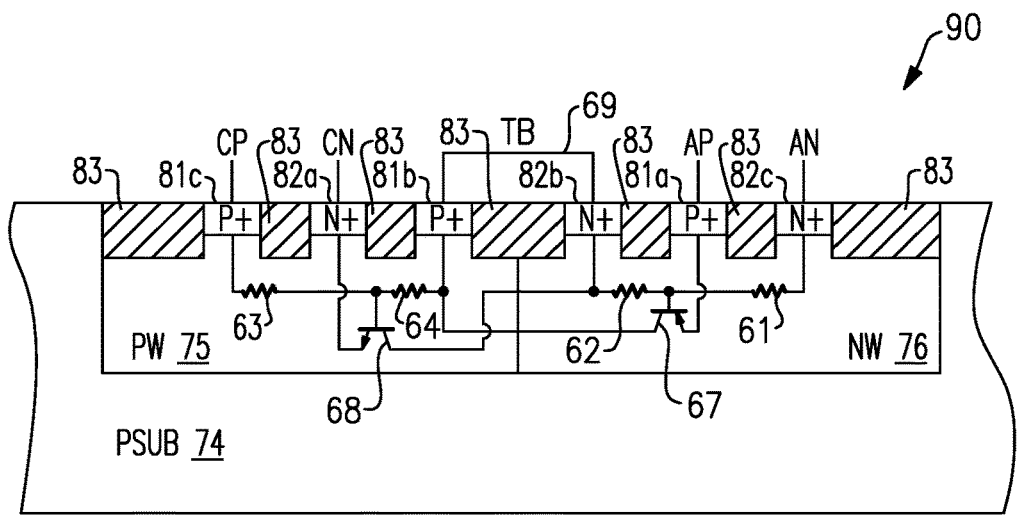
FIG. 2A is a cross section of a resistive thyristor topology according to one embodiment.

FIG. 2A is a schematic diagram of a cross section of a resistive thyristor 90 according to one embodiment. When viewed from above, the resistive thyristor 90 can have a layout implemented in a wide variety of ways, such as a planar layout configuration or annular configuration.

In the illustrated embodiment, the resistive thyristor 90 is formed directly in a p-type substrate (PSUB) 74. However, the teachings herein are applicable to other configurations, such as implementations in which a substrate includes a p-type epitaxial layer over a doped or undoped support substrate, and the resistive thyristor 90 is fabricated in the p-type epitaxial layer. Although not illustrated in FIG. 2A, the PSUB 74 typically includes other devices or structures formed therein. For example, the resistive thyristor 90 can be fabricated along with core circuitry and other protection devices in a common substrate.

The resistive thyristor 90 includes a p-type well region (PW) 75 and an n-type semiconductor well region (NW) 76 formed in the PSUB 74. Additionally, various p-type active (P+) regions and n-type active (N+) regions have been depicted. The P+ regions have a higher doping concentration than the PW 75, which in turn have a higher doping concentration than the PSUB 74. Additionally, the N+ regions have a higher doping concentration than the NW 76. Persons having ordinary skill in the art will appreciate various concentrations of dopants in the regions.

It should be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in the figures of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorous, as a dopant.

Although electrical connections are illustrated schematically using lines over the PSUB 74, persons having ordinary skill in the art will appreciate that the annotated electrical connections can be made in part using metallization via back-end processing. Moreover, in certain implementations, bond pads or other structures can be included. Such details are omitted for clarity of the figures.

The resistive thyristor 90 has been schematically annotated to show certain electrical connections and devices, including a first resistor 61, a second resistor 62, a third resistor 63, a fourth resistor 64, a PNP bipolar transistor 67, an NPN bipolar transistor 68, and a metal conductor 69.

The PNP bipolar transistor 67 includes an emitter associated with P+ region 81a, a base associated with NW 76 and N+ region 82c, and a collector associated with PW 75 and P+ region 81b. Additionally, the NPN bipolar transistor 68 includes an emitter associated with N+ region 82a, a base associated with PW 75 and P+ region 81c, and a collector associated with NW 76 and N+ region 82b. Furthermore, the first resistor 61 and the second resistor 62 are associated with a resistance of the NW 76, while the third resistor 63 and the fourth resistor 64 are associated with a resistance of the PW 75.

The illustrated embodiment also includes STI regions 83. Formation of the STI regions 83 can include etching trenches in the P-SUB 74, filling the trenches with a dielectric, such as silicon dioxide (SiO$_2$), and removing the excess dielectric using any suitable method, such as chemical-mechanical planarization.

As shown in FIG. 2A, each of the PW 75 and the NW 76 has a depth into the P-SUB 74 that is greater than a depth into the P-SUB 74 than both the STI regions 83 and the P+ and N+ active regions 81a-81c and 82a-82c. Additionally, the STI regions 83 have a depth into the P-SUB 74 that is greater than that of the N+ and P+ regions 81a-81c and 82a-82c.

As shown in FIG. 2A, a first piece of metallization or metal conductor 69 serves as a bypass terminal (TB) used to connect the P+ region 81b in the PW 75 to the N+ region 82b in the NW 76. Additionally, a second piece of metallization is used to connect the N+ region 82a to a first cathode terminal (CN), a third piece of metallization is used to connect the P+ region 81c to a second cathode terminal (CP), a fourth piece of metallization is used to connect the P+ region 81a to a first anode terminal (AP), and a fifth piece of metallization is used to connect to the N+ region 82c to a second anode terminal (AN). Such metallization can be made using metal layers and vias during backend processing.

Thus, in the illustrated embodiment, the P+ and N+ diffusions associated with the anode and cathode are divided into independent terminals (AP, AN, CP and CN). Furthermore, the well region pick-ups are intentionally connected to the bypass terminal (TB). At low current level, this structure exhibits a resistive current conduction characteristic from the second anode terminal (AN) to the second cathode terminal (CP), with a resistance value represented by the sum of the resistances of the first resistor 61, the second resistor 62, the third resistor 63, and the fourth resistor 64. As the current increases, the voltage drop through the well resistors becomes high enough to turn-on the PNP bipolar transistor 67 and the NPN bipolar transistor 68, activating at high current the low resistance SCR regenerative feedback conduction path from the first anode terminal (AP) to the first cathode terminal (CN).

Thus, the metal conductor 69 serves to bypass the semiconductor interface or p-n junction between the PW 75 and the NW 76. This in turn provides an electrical connection between the second cathode terminal (CP) and the second anode terminal (AN) through a series combination of the first resistor 61, the second resistor 62, the third resistor 63, and the fourth resistor 64.

In certain implementations, the path through the resistors 61-64 and metal conductor 69 is active when the p-n junction between the PW 75 and the NW 76 is blocking, and thus the resistive thyristor 90 behaves as a resistor at low current levels. However, at high current levels the bipolar transistors provide regenerative feedback such that the resistive thyristor 90 behaves as a thyristor.

Figure 2B:
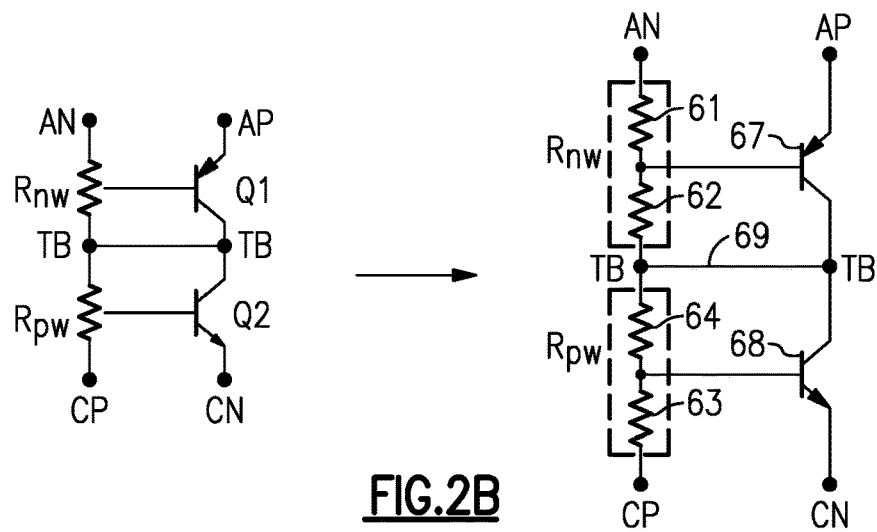
FIG. 2B is a circuit diagram of the resistive thyristor of FIG. 2A.

FIG. 2B is a circuit diagram of the resistive thyristor of FIG. 2A. The resistive thyristor includes a first resistor 61, a second resistor 62, a third resistor 63, a fourth resistor 64, a PNP bipolar transistor 67, and an NPN bipolar transistor 68. Another representation of the resistive thyristor is depicted, in which the first resistor 61 and the second resistor 62 are represented as an n-well resistive voltage divider Rnw, and in which the third resistor 63 and the fourth resistor 64 are represented as a p-well resistive voltage divider Rpw.

As shown in FIG. 2B, the emitter of the PNP bipolar transistor 67 is electrically connected to the first anode terminal (AP), and the first resistor 61 is electrically connected between the second anode terminal (AN) and the base of the PNP bipolar transistor 67. Furthermore, the collector of the PNP bipolar transistor 67 and the collector of the NPN bipolar transistor 68 are electrically connected to the metal conductor 69 serving as the bypass terminal (TB). Additionally, the second resistor 62 is electrically connected between the base of the PNP bipolar transistor 67 and the bypass terminal (TB).

With continuing reference to FIG. 2B, the emitter of the NPN bipolar transistor 68 is electrically connected to the first cathode terminal (CP), and the third resistor 63 is electrically connected between the second cathode terminal (CN) and the base of the NPN bipolar transistor 68. Additionally, the fourth resistor 64 is electrically connected between the base of the NPN bipolar transistor 68 and the bypass terminal (TB).

The resistive thyristor is implemented with cross-coupling between the PNP bipolar transistor 67 and the NPN bipolar transistor 68. Thus, regenerative feedback is provided when the resistive thyristor is operating at high current levels.

However, the resistive thyristor further includes the metal conductor 69 between the collector of the PNP bipolar transistor 67 and the collector of the NPN bipolar transistor 68.

By including the electrical connection 69 between the collectors of the transistors, the resistive thyristor behaves as a thyristor at high current levels and as a resistor at low current levels. Thus, the resistive thyristor exhibits both thyristor characteristics and resistive characteristics based on a level of current flow.

Figure 2C:
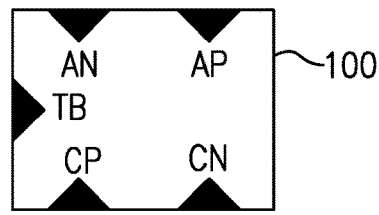
FIG. 2C is a schematic symbol representation of a resistive thyristor.

FIG. 2C is a schematic representation of a resistive thyristor 100, such as the resistive thyristor 90 of FIG. 2A. As shown in FIG. 2C, the symbolic representation of the resistive thyristor 100 includes a bypass terminal (TB), a first cathode terminal (CN), a second cathode terminal (CP), a first anode terminal (AP), and a second anode terminal (AN).

Figure 3A:
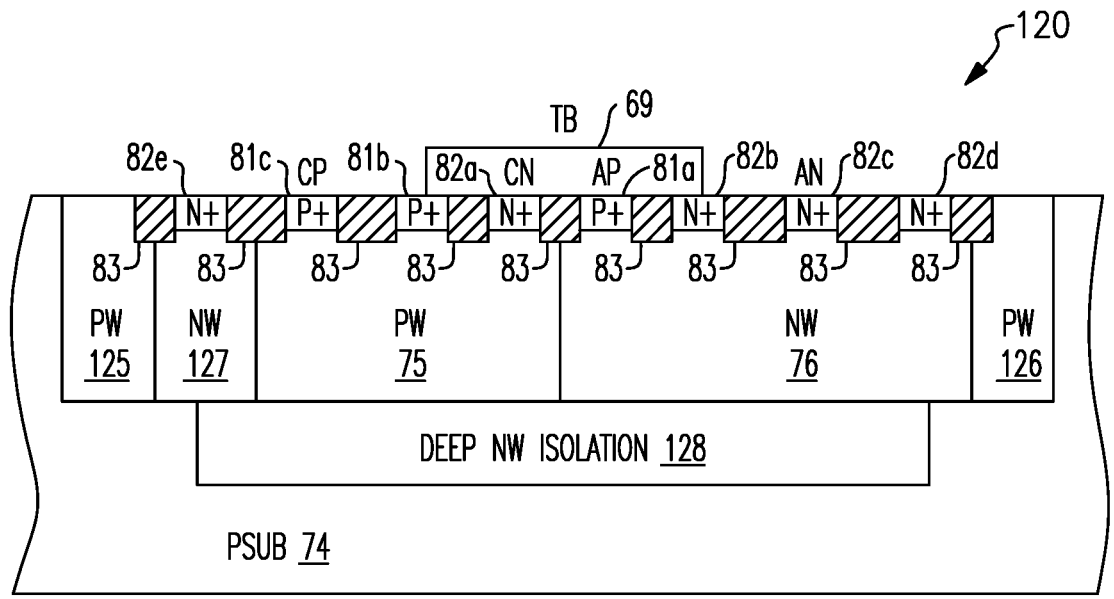
FIG. 3A is a cross section of an isolated resistive thyristor according to another embodiment.

FIG. 3A is a cross section of a resistive thyristor 120 according to another embodiment. When viewed from above, the resistive thyristor 120 can have a layout implemented in a wide variety of ways, such as a planar layout configuration or an annular configuration.

The resistive thyristor 120 of FIG. 3A is similar to the resistive thyristor 90 of FIG. 2A, except that the resistive thyristor 120 further includes a well isolation structure, and illustrates an implementation in which the position of the P+ region 81b and the N+ region 82a is reversed and in which the position of the P+ region 81a and the N+ region 82b is reversed. By reversing the diffusion regions in this manner, a decrease in the resistance through the device's n-well and p-well resistors is reduced relative to the embodiment of FIG. 2A.

In the illustrated embodiment, the resistive thyristor 120 is implemented with an isolation structure that includes N+ region 82d in NW 76, NW 127, N+ region 82e in NW 127, PW 125, PW 126, and deep NW isolation region 128. The structures serve as a tub for providing voltage blocking and inhibiting carriers from being injected by the resistive thyristor 120 into the PSUB 74. Although one embodiment of an isolation structure is depicted, the resistive thyristors herein can be implemented with a wide variety of types of isolation structures.

Figure 3B:
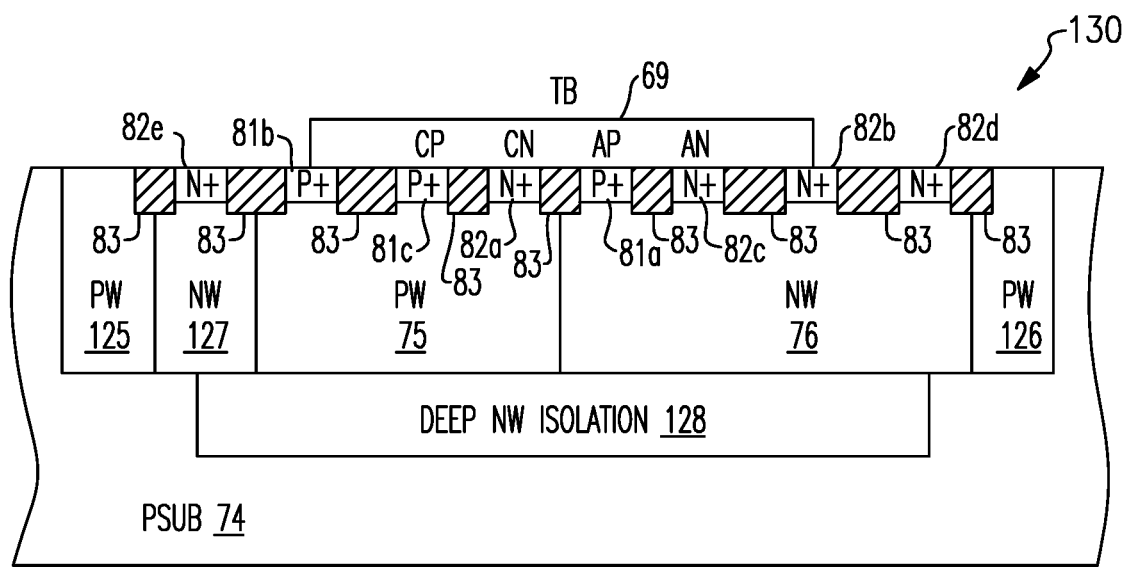
FIG. 3B is a cross section of an isolated resistive thyristor according to another embodiment.

FIG. 3B is a cross section of a resistive thyristor 130 according to another embodiment. When viewed from above, the resistive thyristor 130 can have a layout implemented in a wide variety of ways, such as a planar layout configuration or annular configuration.

The resistive thyristor 130 of FIG. 3B is similar to the resistive thyristor 120 of FIG. 3A, except that the resistive thyristor 130 illustrates an implementation in which the position of the P+ region 81c and the P+ region 81b is reversed and in which the position of the N+ region 82b and the N+ region 82c is reversed. By reversing the diffusion regions in this manner, a decrease in the resistance through the device's n-well and p-well resistors is reduced relative to the embodiment of FIG. 3A.

Figure 4:
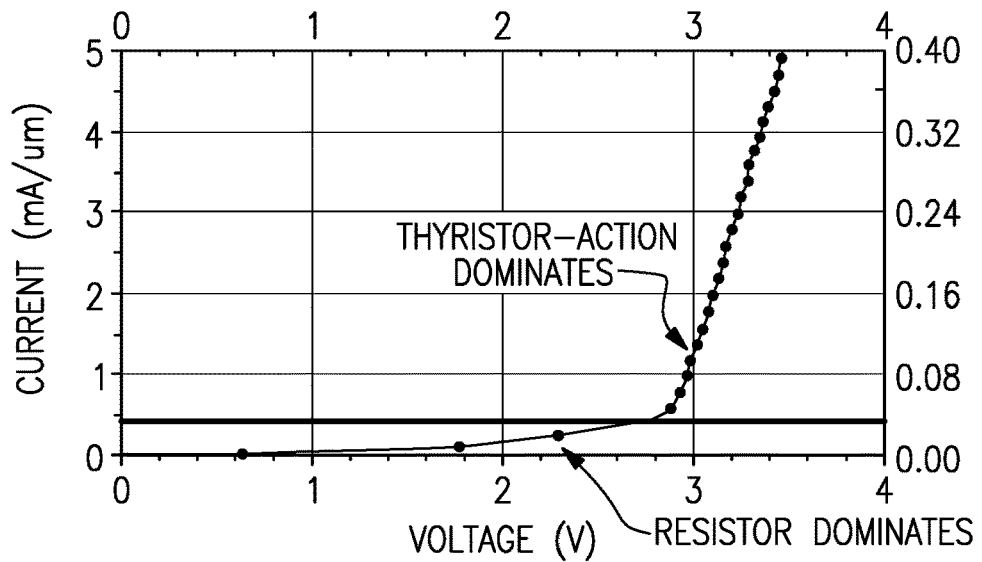
FIG. 4 is a graph of transmission line pulsing (TLP) characterization data for one implementation of the resistive thyristor of FIG. 2A.

FIG. 4 is a graph of transmission line pulsing (TLP) data for one implementation of the resistive thyristor 90 of FIG. 2A. The graph depicts an I-V curve under 100 ns pulse width/600 ps rise time TLP testing. For the depicted TLP test results, the first anode terminal (AP) and the second anode terminal (AN) were bonded to one another to serve as anode, the first cathode terminal (CP) and the second cathode terminal (CN) were bonded to one another to serve as cathode, and the bypass terminal (TB) was electrically floating. As shown in FIG. 4, the resistor dominates for low current levels (e.g., less than about 0.5 mA/μm) and the thyristor-action dominates for high current levels (e.g., greater than about 0.5 mA/μm).

Figure 5A:
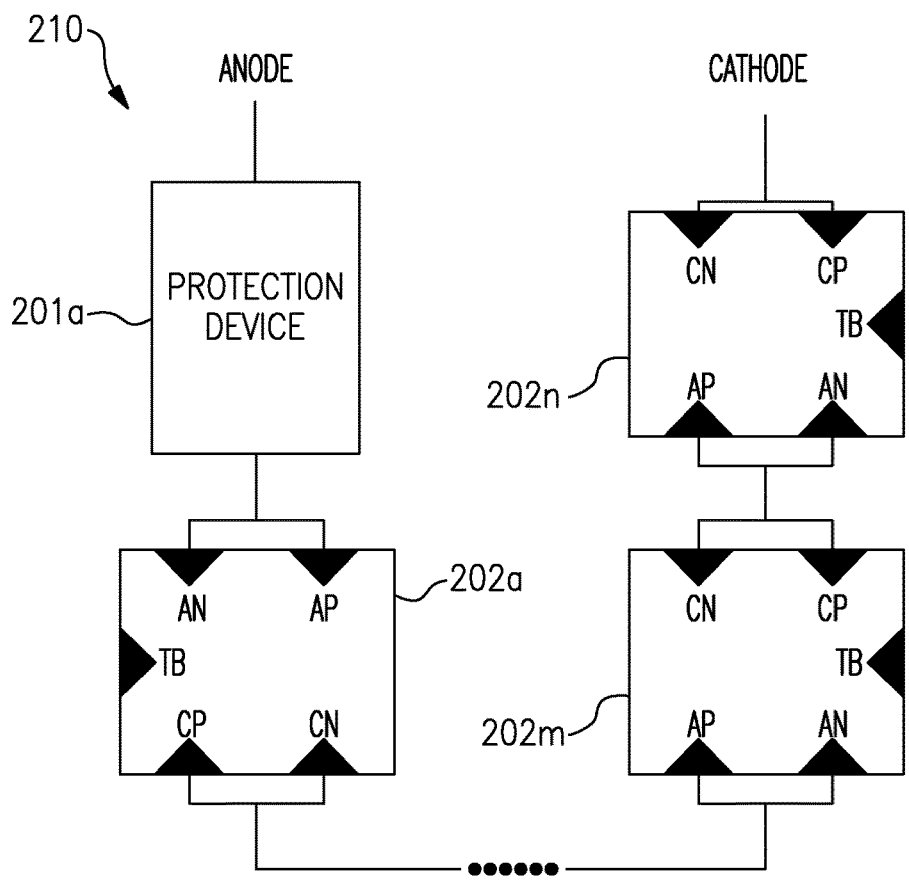
FIG. 5A is a schematic diagram of an electrical overstress protection system using stacking according to one embodiment.

FIG. 5A is a schematic diagram of an electrical overstress protection system 210 using stacking according to one embodiment. The electrical overstress protection system 210 includes a protection device 201a and resistive thyristors 202a ... 202m, 202n. The protection device 201a and each of the resistive thyristors 202a ... 202m, 202n are electrically connected in a stack between an anode node (which can be connected to a first pad, such as a signal pad) and a cathode node (which can be connected to a second pad, such as a ground pad).

As shown in FIG. 5A, the AN and AP terminals of a given resistive thyristor in the stack are shorted and connected to the CN and CP terminals of an adjacent resistive thyristor in the stack. Additionally, the AN and AP terminals of the resistive thyristor 202a are connected to the cathode terminal of the protection device 201a.

By stacking N resistive thyristors with a protection device 201a, such as standard SCR or other suitable protection clamp depicting a low holding voltage, at the trigger current $I_{t1}$, the extra voltage drop $\Delta V$ (or shift of trigger voltage) caused by the inclusions of the 5-terminal resistive thyristors 202a ... 202m, 202n can be estimated by Equation 1 below.

$$\Delta V = N*(Rnw+Rpw)*I_{t1} \qquad \text{Equation 1}$$

To reduce the impact of stacking on the overall trigger voltage, according to Equation 1 one or more of the n-well resistance Rnw, the p-well resistance Rpw, or the holding current $I_{t1}$ should be decreased. Addressing this at the device construction can be an option, but this can involve device physics optimization not always viable within the technology constraints or manufacturing design rules (for example, modifying the distance from AN to TB and TB to CP in FIG. 2A). Within the metallization constraints, an option can be as well the adoption of different terminal arrangements as discussed above with the embodiments of FIGS. 3A and 3B. Additionally or alternatively, the resistive thyristor can be stacked differently to reduce ΔV without needing device-level modifications as discussed below.

Figure 5B:
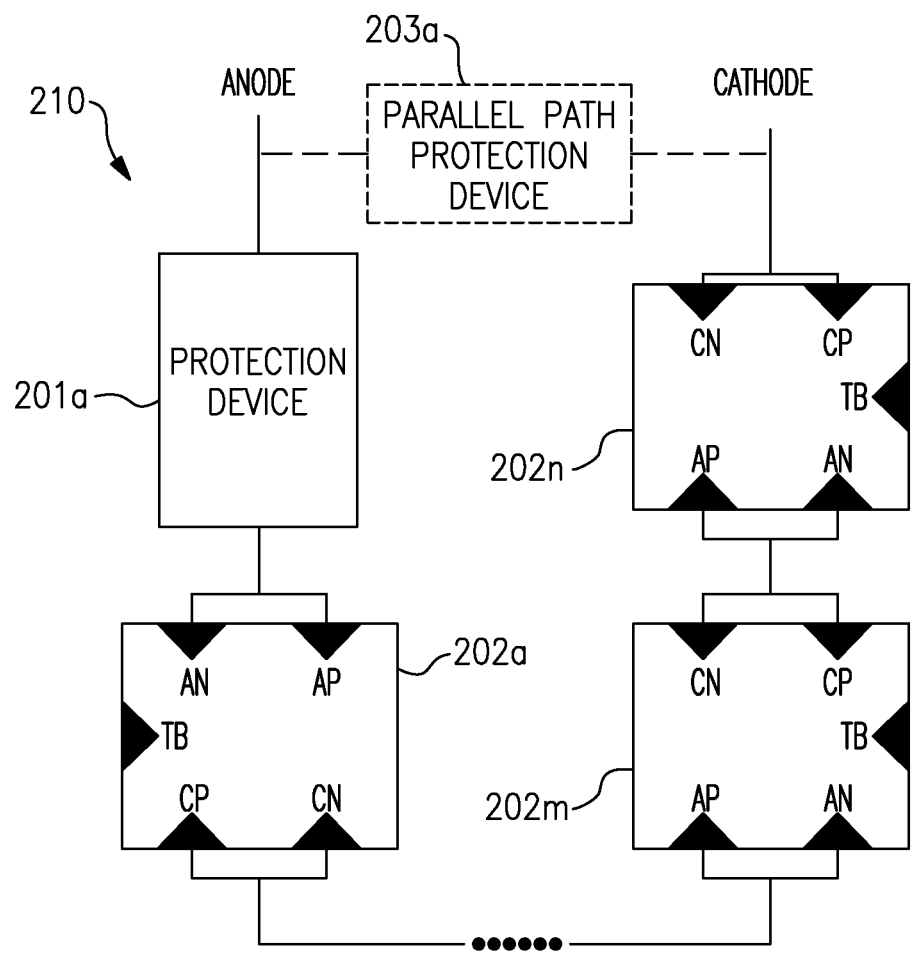
FIG. 5B is a schematic diagram of an electrical overstress protection system using stacking according to another embodiment.

FIG. 5B is a schematic diagram of an electrical overstress protection system 210 using stacking according to another embodiment. The electrical overstress protection system 210 includes a protection device 201a, resistive thyristors 202a ... 202m, 202n, and a parallel path protection device 203a. The electrical overstress protection system 210 of FIG. 5B is similar to the electrical overstress protection system 210 of FIG. 5A with the addition of the parallel path protection device 203a connected between the anode node and the cathode node.

Figure 5C:
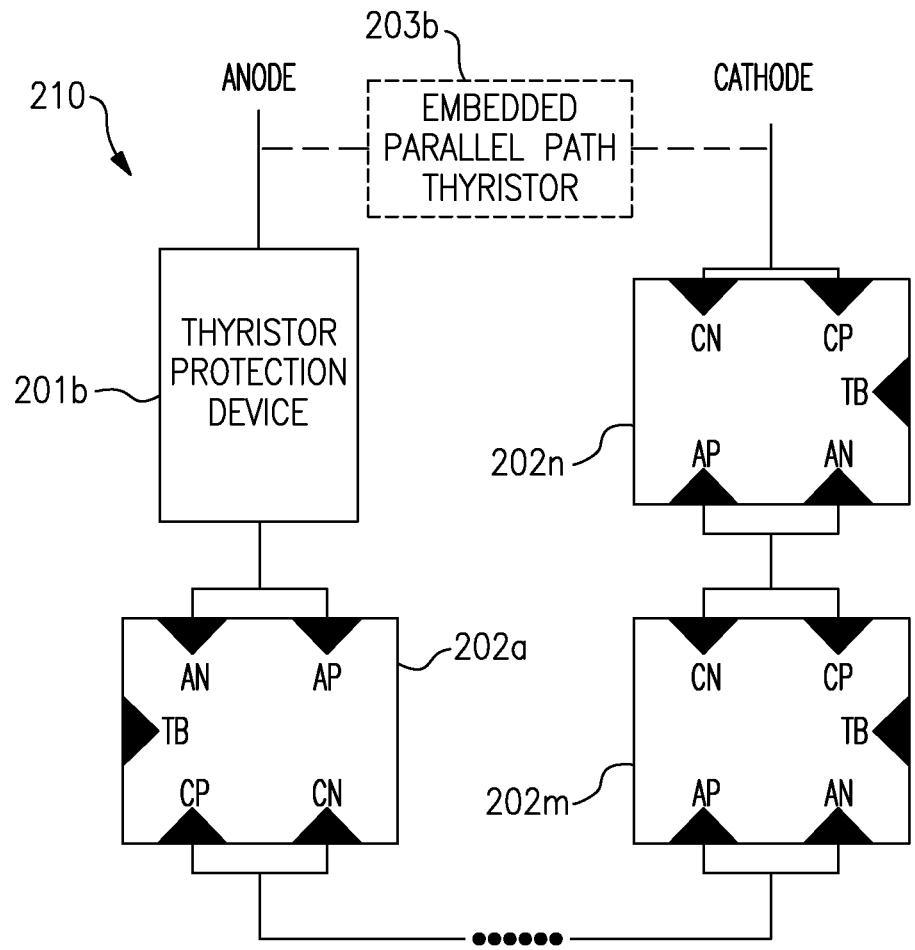
FIG. 5C is a schematic diagram of an electrical overstress protection system using stacking according to yet another embodiment.

FIG. 5C is a schematic diagram of an electrical overstress protection system 210 using stacking according to yet another embodiment. The electrical overstress protection system 210 includes a thyristor protection device 201b, resistive thyristors 202a ... 202m, 202n, and an embedded parallel path thyristor 203b. The electrical overstress protection system 210 of FIG. 5C is similar to the electrical overstress protection system 210 of FIG. 5A in which the thyristor protection device 201b is connected between the anode node and the AN and AP terminals of the resistive thyristor 202a and the embedded parallel path thyristor 203b connected between the anode node and the cathode node.

Figure 6A:
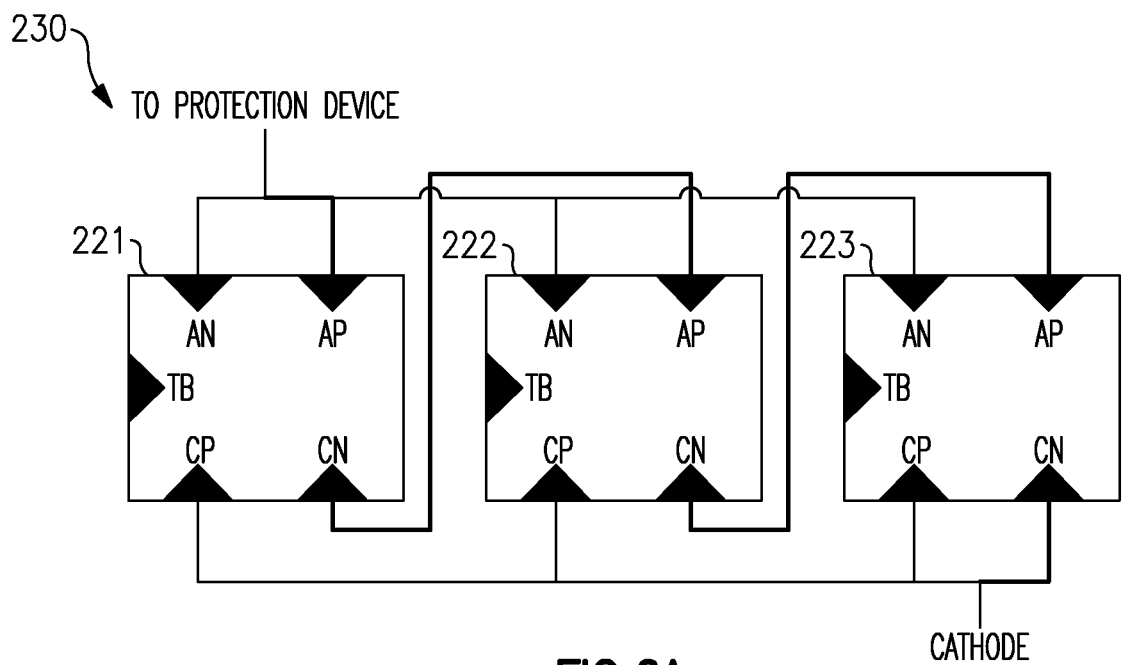
FIG. 6A a schematic diagram of an electrical overstress protection system using folded stacking according to one embodiment.
Figure 6B:
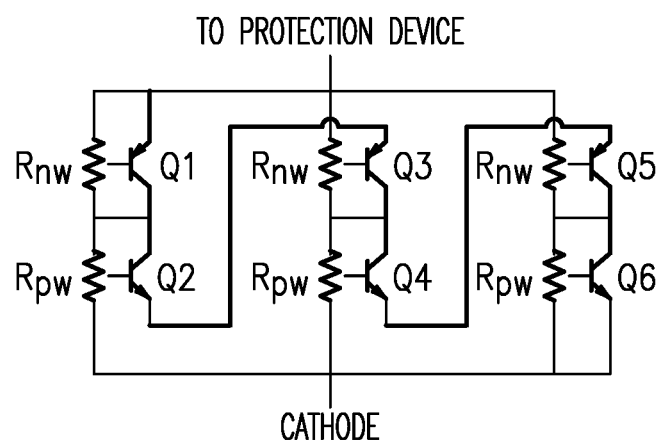
FIG. 6B is a circuit diagram of the electrical overstress protection system of FIG. 6A.

FIG. 6A a schematic diagram of an electrical overstress protection system 230 using folded stacking according to one embodiment. FIG. 6B is a circuit diagram of the electrical overstress protection system 230 of FIG. 6A.

The electrical overstress protection system 230 includes a first resistive thyristor 221, a second resistive thyristor 222, and a third resistive thyristor 223, which are electrically connected in a stack with a protection device (e.g., a standard SCR (not shown in FIG. 6A)). Although an example with three resistive thyristors is depicted, more or fewer resistive thyristors can be stacked in the manner illustrated.

In the illustrated embodiment, the CN terminal of one resistive thyristor is connected to the AP terminal of adjacent resistive thyristor in the stack. However, each AN terminal of the resistive thyristors are connected to one another, and each CP terminal of the resistive thyristors are connected to one another.

With respect to a single resistive thyristor, from the AN terminal to the CP terminal a resistive path is formed, and from the AP terminal to the CN terminal the SCR conduction path is formed in parallel. To increase the holding voltage, the SCR path of each padding element must be formed in series. On the other hand, the resistive path does have a minor impact on the trigger voltage of the previous device arrangement. Considering this additional understanding in the clamp design optimization, keeping the SCR paths in series while putting resistive path in parallel (as shown in FIG. 6A) can further aid optimizing the device performance. This stacking method is hereinafter referred to as "padding clamp folded stacking." By modifying the interconnectivity of the devices improvements in performance can be obtained while preserving the padding clamp geometry if desired.

Considering the padding clamp folded stacking arrangement in FIG. 6A, when it is connected in series with another low holding voltage clamp, for instance a more conventional SCR, the current level is low, and the parasitic transistors are in off-state. The effective resistance of the folded stacked padding clamps in this case is approximately (Rnw+Rpw)/N. Then the shift of trigger voltage is further reduced as estimated by Equation 2 below.

$$\Delta V = (Rnw+Rpw)*I_{t1}/N \qquad \text{Equation 2}$$

Compared to the results in Equation 1, the folded stacking method has a smaller impact on the trigger voltage when using the same N stacking of padding clamps. For example, considering the circuit diagram in FIG. 6B, the EB(BE) junction of Q1 and Q6 (the first and last transistors) can experience higher voltage drop than other transistors. This can induce uneven triggering of the SCR path of the resistor thyristors in this second arrangement. For example, with the folded padding clamp stacking connection, the last 5-terminal padding clamp (e.g., the resistive thyristor 223 in FIG. 6A) is turned on first and the other padding clamps remain in resistive mode.

Figure 7A:
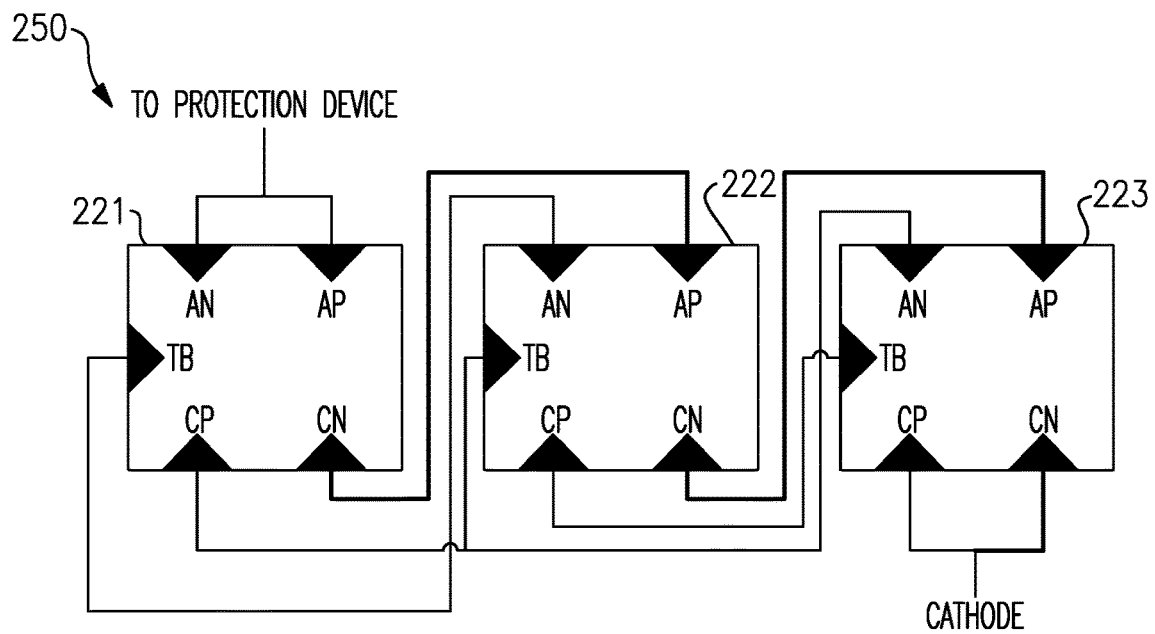
FIG. 7A a schematic diagram of an electrical overstress protection system using modified folded stacking according to one embodiment.
Figure 7B:
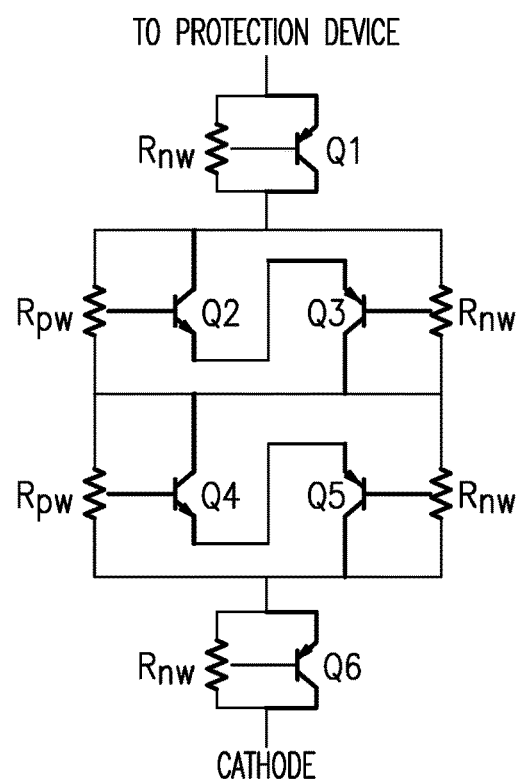
FIG. 7B is a circuit diagram of the electrical overstress protection system of FIG. 7A.

FIG. 7A a schematic diagram of an electrical overstress protection system 250 using modified folded stacking according to one embodiment. FIG. 7B is a circuit diagram of the electrical overstress protection system 250 of FIG. 7A.

The electrical overstress protection system 250 includes a first resistive thyristor 221, a second resistive thyristor 222, and a third resistive thyristor 223, which are electrically connected in a stack with a protection device (e.g., a standard SCR (not shown in FIG. 7A)). Although an example with three resistive thyristors is depicted, more or fewer resistive thyristors can be stacked in the manner illustrated.

In the illustrated embodiment, the CN terminal of one resistive thyristor is connected to the AP terminal of adjacent resistive thyristor in the stack as was the case for the embodiment of FIG. 6A. However, in contrast to the embodiment of FIG. 6A in which the TB terminals are electrically floating, the embodiment of FIG. 7A connects the TB terminal of one resistive thyristor in the stack to the AN terminal of adjacent resistive thyristor in the stack and connects the CP terminal of one resistive thyristor in the stack to the TB terminal of the adjacent resistive thyristor in the stack.

Thus, in the modified folding stacking arrangement, the SCR paths (Q1-Q6) of the resistive thryristors are still in series. The resistive path of each resistive thyristor is divided into two parts: Rnw and Rpw. For each resistive thyristor, its resistor Rnw is shunt with the resistor Rpw of the previous resistive thyristor in the stack. In this way, the resistive thyristors in clusters are cross connected together. This connection allows all the SCR path of the resistive thyristors to turn-on at the same time. Thus, the each of the resistive thyristors are turned on at the trigger point of a standard SCR when using the modified folded stacking arrangement.

The minor shift in trigger voltage by implementing this structure is estimated by Equation 3.

$$\Delta V = [(Rnw+Rpw)+N*Rnw//Rpw]*I_{t1} \qquad \text{Equation 3}$$

Figure 8:
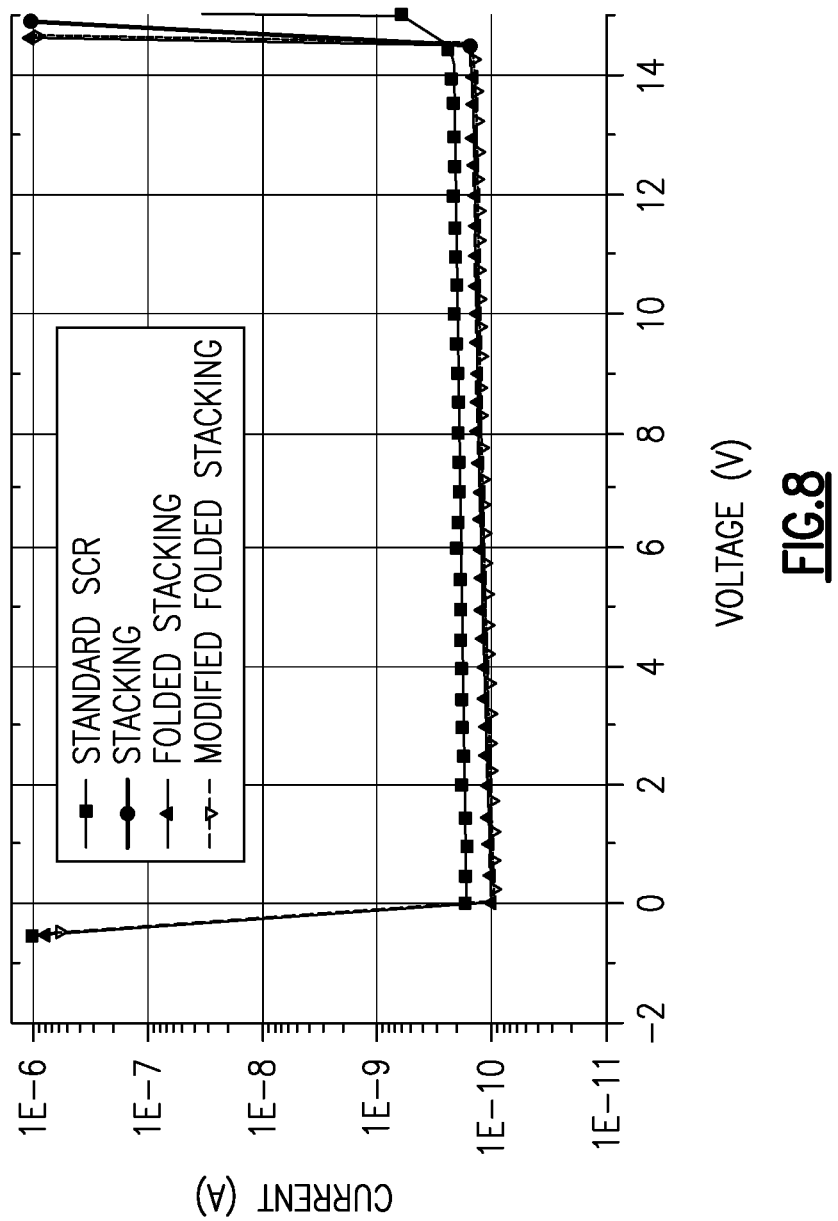
FIG. 8 is a graph comparing DC current versus voltage sweeps for various thyristor protection structures.
Figure 9A:
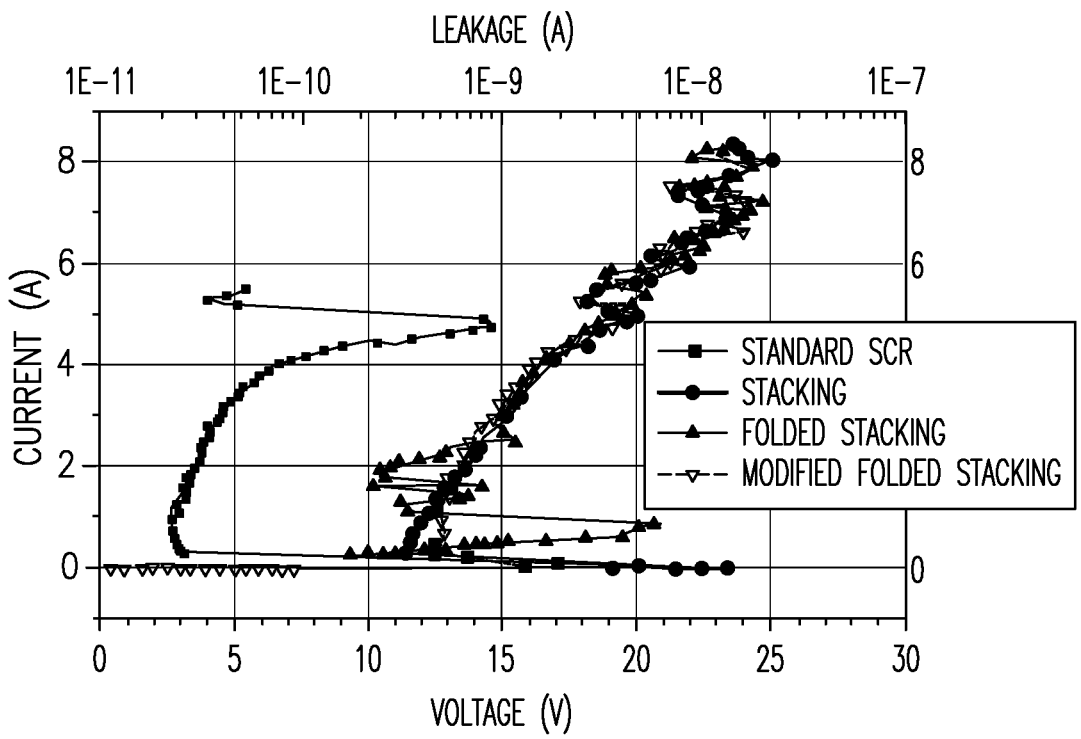
FIG. 9A is a graph comparing TLP test results for various thyristor protection structures.
Figure 9B:
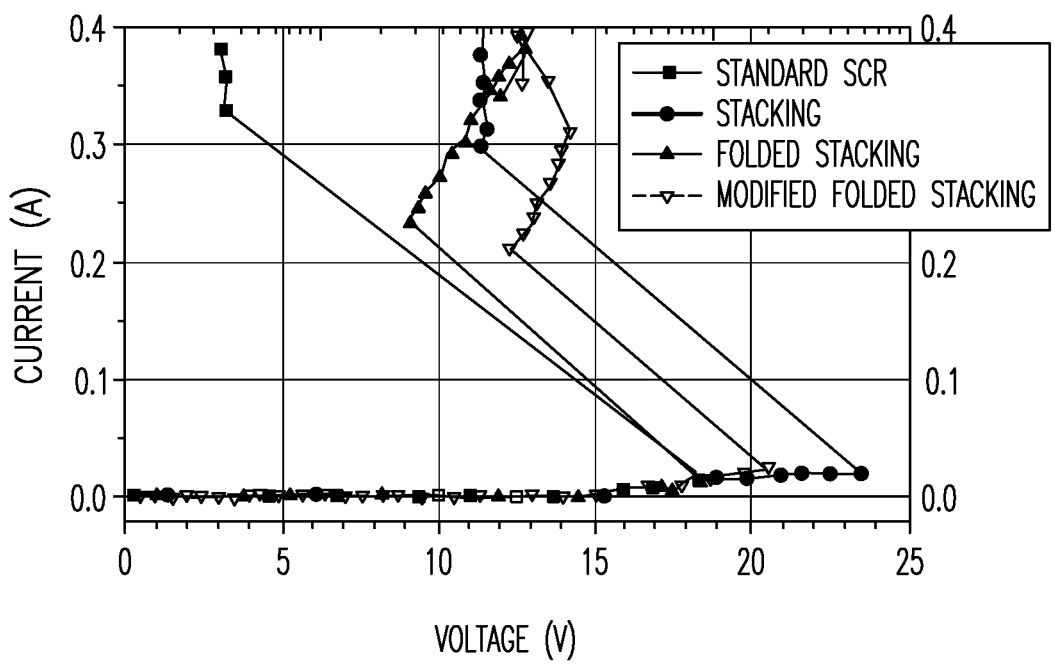
FIG. 9B is an expanded view of a portion of the TLP test results of FIG. 9A.

FIGS. 8, 9A, and 9B related to measurements of the stacking arrangement of FIGS. 5A-5C, the folded stacking arrangement of FIG. 6A, and the modified folded stacking arrangement of FIG. 7A relative to a standard SCR alone. The measurements are for an implementation fabricated in BCD (Bipolar, CMOS, DMOS) process for mixed signal precision interface applications. In each stacking structure, 3 5-terminal padding clamps are arranged in series with a more conventional low holding voltage SCR. For reference, all the devices are sized as 80 um width.

FIG. 8 is a graph comparing DC current versus voltage sweeps for various thyristor protection structures. The DC sweeping result shows that all stacking methods with 5-terminal resistive thyristors have no impact on the DC breakdown voltage.

FIG. 9A is a graph comparing TLP test results for various thyristor protection structures. FIG. 9B is an expanded view of a portion of the TLP test results of FIG. 9A.

TLP testing is also performed on devices using 100 ns TLP pulse with 2 ns rising time. The sampled IV-curve with leakage results are summarized the graphs. In the full view depicted in FIG. 9A, the different stacking topologies with three 5-terminal resistive thyristors show significant improvement on the holding voltage. The curve of folded stacking structure exhibits a zigzag shape to approach a stable holding state, which is related to the uneven triggering. In the folded stacking structure, different resistive thyristors are triggered at different current levels, resulting in multiple snapbacks during the device on-state condition.

A zoom-in view near the trigger point in FIG. 9B shows the influence of stacking on the trigger voltage. The control stacking has about 5 V increment on the trigger voltage comparing to the standalone SCR. With smaller effective resistance value, the use of the modified folded padding clamp array reduces the trigger voltage shift to 2 V. This folded stacking array results in the smallest impact in the trigger voltage. The results are consistent with the theoretical analysis in the Equations provided above.

With reference to FIGS. 9A and 9B, the failure current of stacking structures increases in comparison with the failure current for the single low holding voltage SCR clamp. Because no guard-ring is included in-between the 5-terminal padding clamps and the baseline SCR, at high current state, the extra embedded thyristor (for example, the embedded parallel path thyristor 203 of FIG. 5C) between the low holding voltage baseline SCR clamp and the last 5-terminal padding clamp is activated, which provides an additional parallel current path, improving further the overall current handling capability of the high holding voltage structure, a condition difficult to achieve without a significant increase in the single device area.

Although FIGS. 4, 8, 9A and 9B illustrate examples of simulation results for a protection circuit, other simulation results are possible, including results that depend on implementation, application, and/or processing technology.

Applications

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments.

What is claimed is:

1. A stacked thyristor protection structure with high holding voltage, the stacked thyristor protection structure comprising:
    a protection device; and
    a first resistive thyristor comprising a PNP bipolar transistor and a NPN bipolar transistor that are cross-coupled, a first conductor connecting a collector of the PNP bipolar transistor to a collector of the NPN bipolar transistor, a p-type semiconductor well region (PW) configured to operate as a base of the NPN bipolar transistor and as the collector of the PNP bipolar transistor, an n-type semiconductor well region (NW) adjacent to the first PW and configured to operate as a base of the PNP bipolar transistor and as the collector of the NPN bipolar transistor, a trench isolation region between the NW and the PW, a first p-type active (P+) region formed in the NW and configured to operate as an emitter of the PNP bipolar transistor, a first n-type active (N+) region formed in the NW, a second N+ region formed in the PW and configured to operate as an emitter of the NPN bipolar transistor, a second P+ region formed in the PW, a second conductor connecting the second P+ region to the second N+ region, and a third conductor connecting the first P+ region and the first N+ region to a first terminal of the protection device.

2. The stacked thyristor protection structure of claim 1, wherein the protection device comprises a thyristor electrically connected to the first resistive thyristor.

3. The stacked thyristor protection structure of claim 1, further comprising an embedded resistive connection between the base of the PNP bipolar transistor and the base of the NPN bipolar transistor of the first resistive thyristor.

4. The stacked thyristor protection structure of claim 1, wherein the first resistive thyristor further includes a third P+ region in the PW and a third N+ region in the NW, wherein the first conductor includes metallization connecting the third P+ region to the third N+ region.

5. The stacked thyristor protection structure of claim 4, wherein the trench isolation region is positioned between the third P+ region and the third N+ region.

6. The stacked thyristor protection structure of claim 1, wherein the first conductor is configured to bypass a semiconductor interface between the PW and the NW.

7. The stacked thyristor protection structure of claim 1, wherein the first resistive thyristor includes a low current path through the NW, the first conductor, and the PW, and a high current path through a semiconductor interface between the PW and the NW.

8. The stacked thyristor protection structure of claim 1, further comprising one or more additional resistive thyristors in a stack with the first resistive thyristor and each of the one or more additional resistive thyristors having a first anode terminal, a second anode terminal, a first cathode terminal, a second cathode terminal, and a bypass terminal.

9. The stacked thyristor protection structure of claim 8, wherein the first anode terminal and second anode terminal of one resistive thyristor in the stack are electrically connected to one another and to the first cathode terminal and second cathode terminal of an adjacent resistive thyristor in the stack.

10. The stacked thyristor protection structure of claim 8, wherein the first anode terminal of one resistive thyristor in the stack is electrically connected to the first cathode terminal of an adjacent resistive thyristor in the stack.

11. The stacked thyristor protection structure of claim 1, implemented in an automotive lidar system.

12. The stacked thyristor protection structure of claim 1, implemented in an automotive high definition camera system, stacked thyristor protection structure.

13. A resistive thyristor with a high holding voltage, comprising:
    a PNP bipolar transistor;
    a NPN bipolar transistor cross-coupled with the PNP bipolar transistor;
    a first conductor connecting a collector of the PNP bipolar transistor to a collector of the NPN bipolar transistor;
    a p-type semiconductor well region (PW) configured to operate as a base of the NPN bipolar transistor and as the collector of the PNP bipolar transistor;
    an n-type semiconductor well region (NW) adjacent to the first PW and configured to operate as a base of the PNP bipolar transistor and as the collector of the NPN bipolar transistor;
    a trench isolation region between the NW and the PW;
    a first p-type active (P+) region formed in the NW and configured to operate as an emitter of the PNP bipolar transistor;
    a first n-type active (N+) region formed in the NW;
    a second N+ region formed in the PW and configured to operate as an emitter of the NPN bipolar transistor;
    a second P+ region formed in the PW;
    a second conductor connecting the second P+ region to the second N+ region; and
    a third conductor connecting the first P+ region and the first N+ region.

14. The resistive thyristor of claim 13, further comprising third P+ region in the PW, and a third N+ region in the NW, the first conductor including metallization connecting the third P+ region to the third N+ region.

15. The resistive thyristor of claim 14, wherein the trench isolation region is positioned between the third P+ region and the third N+ region.

16. A semiconductor die comprising:
a first pad and a second pad; and
a stacked thyristor protection structure electrically connected between the first pad and the second pad, the stacked thyristor protection structure comprising:
a protection device having a holding voltage; and
a first resistive thyristor comprising a PNP bipolar transistor and a NPN bipolar transistor that are cross-coupled, a first conductor connecting a collector of the PNP bipolar transistor to a collector of the NPN bipolar transistor, a p-type semiconductor well region (PW) configured to operate as a base of the NPN bipolar transistor and as the collector of the PNP bipolar transistor, an n-type semiconductor well region (NW) adjacent to the first PW and configured to operate as a base of the PNP bipolar transistor and as the collector of the NPN bipolar transistor, a trench isolation region between the NW and the PW, a first p-type active (P+) region formed in the NW and configured to operate as an emitter of the PNP bipolar transistor, a first n-type active (N+) region formed in the NW, a second N+ region formed in the PW and configured to operate as an emitter of the NPN bipolar transistor, a second P+ region formed in the PW, a second conductor connecting the second P+ region to the second N+ region, and a third conductor connecting the first P+ region and the first N+ region to a first terminal of the protection device.

17. The semiconductor die of claim 16, implemented in an automotive lidar system.

18. The semiconductor die of claim 16, implemented in an automotive high definition camera system.

19. The semiconductor die of claim 16, wherein the first resistive thyristor further comprises a third P+ region in the PW and a third N+ region in the NW, the first conductor including metallization connecting the third P+ region to the third N+ region.

20. The semiconductor die of claim 16, wherein the trench isolation region is positioned between the third P+ region and the third N+ region.

* * * * *